United States Patent
Takahashi

(10) Patent No.: US 6,537,719 B1
(45) Date of Patent: Mar. 25, 2003

(54) PHOTOSENSITIVE RESIN COMPOSITION

(75) Inventor: Shuichi Takahashi, Shizuoka (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/673,547

(22) PCT Filed: Jan. 24, 2000

(86) PCT No.: PCT/JP00/00318

§ 371 (c)(1),
(2), (4) Date: Oct. 13, 2000

(87) PCT Pub. No.: WO00/48044

PCT Pub. Date: Aug. 17, 2000

(30) Foreign Application Priority Data

Feb. 15, 1999 (JP) .......................................... 11-035797
Feb. 15, 1999 (JP) .......................................... 11-035798

(51) Int. Cl.$^7$ .............................................. G03F 7/023
(52) U.S. Cl. ........................ 430/191; 430/192; 430/193
(58) Field of Search .............................. 430/270.1, 191, 430/192, 193

(56) References Cited

U.S. PATENT DOCUMENTS 5,695,910 A * 12/1997 Urano et al. ............. 430/270.1
6,068,962 A * 5/2000 Uetani et al. ............... 430/191

* cited by examiner

Primary Examiner—John S. Chu
(74) Attorney, Agent, or Firm—Krishna Banerjee

(57) ABSTRACT

A radiation sensitive resin composition which contains a specific amount of a fluorescent material and has high sensitivity, high resolution, excellent highly normalized film remaining characteristics, and capability to form a good pattern. In the case that the radiation sensitive resin composition comprises at least both a resin and a photosensitive material, such as an alkali-soluble novolak resin and a quinonediazide compound, the fluorescent material is used in an amount of 0.0001 to 1.0 parts by weight relative to 100 parts by weight of the photosensitive material. In the case that the radiation sensitive resin composition comprises at least both a resin and a photoacid generator, such as a positive-working or negative-working chemically amplified resist, the fluorescent material is used in an amount of 1.0 to 30.0 parts by weight relative to 100 parts by weight of the photoacid generator. The fluorescent material to be used is an organic fluorescent material such as a naphthalene, an anthracene, a phenanthrene, a pyrene, a perylene, a fluorene, a carbazole, a biphenyl, a p-terphenyl, a p-quaterphenyl, an indole, an acridine, a naphthacene, a rublene, a chrysene, or the like.

4 Claims, No Drawings

PHOTOSENSITIVE RESIN COMPOSITION

TECHNICAL FIELD

The present invention relates to a novel radiation sensitive resin composition and more specifically relates to a radiation sensitive resin composition suitable for use in the production of semiconductors, the fabrication of the display plane of a liquid crystal display device in an LCD panel, and the production of a circuit substrate for a thermal head or the like. Further, the present invention relates to a radiation sensitive resin composition apllicable to all applications besides the above-mentioned applications in which photosensitive properties to exposure radiation are utilized, such as UV inks, UV paints, UV adhesives, photo recording materials, photo molding materials, and so on.

BACKGROUND ART

Photolithographic techniques has been traditionally used for the formation of fine elements or the fine processing in many fields such as the fabrication of semiconductor integrated circuits such as an LSI, the fabrication of the display plane of a liquid crystal display device in an LCD panel, and the production of a circuit substrate for a thermal head or the like. In the photolithography process, a positive-working or negative-working radiation sensitive resin composition is used for forming resist patterns. As one of these radiation sensitive resin compositions, a radiation sensitive resin composition comprising a resin and a photosensitive material has been widely used traditionally. In addition, recently, a radiation sensitive resin composition containing a resin and a photoacid generator, e.g. a chemically amplified radiation sensitive resin composition, has been put to wide uses.

Among these radiation sensitive resin compositions, a typical positive-working radiation sensitive resin composition containing a resin and a photosensitive material is one comprising an alkali-soluble resin and a quinonediazide compound as a photosensitive material. Various kinds of these positive-working radiation sensitive resin compositions containing an alkali-soluble resin and a quinonediazide compound are described, for example, as "novolak resins/quinonediazide compounds" in many documents such as Japanese Patent Application Publication (JP-B) No. 54-23, 570 (U.S. Pat. No. 3,666,473), JP-B No. 56-3 850 (U.S. Pat. No. 4,115,128), Japanese Patent Application Laid-Open (JP-A) No. 55-73,045, JP-A No. 61-205,933. The research and development works of these radiation sensitive resin compositions containing such an alkali-soluble resin and a quinonediazide compound have been hitherto made from both sides of the novolak resins and the photosensitive materials (photosensitizers). From the viewpoint of the novolak resins, radiation sensitive resin compositions with superior characteristics have been obtained by the improvement of the physical properties and others of the resins hitherto known as well as the development of new resins. Techniques providing superior characteristics to radiation sensitive resin compositions are showed in many literatures. That is, a technique using the novolak resin having a specific molecular weight distribution in JP-A Nos. 60-140,235 and 1-105,243 and a technology using a novolak resin whose low-molecular-weight components selectively eliminated in JP-A Nos. 60-97,347 and 60-189,739 and Japanese Patent No. 2,590,342 are described. Furthermore, various new quinonediazide compounds have also been developed, and various types of additives have been proposed too.

Meanwhile, as to the radiation sensitive resin compositions containing a resin and a photoacid generator, various compositions have been known. Examples of these include a negative-working radiation sensitive resin composition comprising a novolak resin and a specific triazine compound as a photoacid generator (JP-A No. 5-303,196), a radiation sensitive resin composition containing a specific resin having a linkage which can be cleaved by an acid (JP-A No. 2-19,847), and a negative- or positive-working radiation sensitive resin composition containing specific basic iodonium compounds (JP-A No. 7-333,844). As described above, many improvements also have been made from the standpoints of resins, photoacid generators, additives, and so on about these radiation sensitive resin compositions comprising a resin and a photoacid generator.

As a result of the former research works, a number of positive- and negative-working radiation sensitive resin compositions have been put to practical use.

However, the degree of integration of semiconductor integrated circuits has been being higher from year to year and patterning with a submicron or halfmicron line width or less has been being required in the production of semiconductors. But by the above-mentioned conventional technique, the requirement cannot be fully satisfied. In addition, in such applications where ultrafine processing are required, together with resolution and good pattern reproduction, the enhancement of the through put (yield per unit time) in the production is also strongly sought from the viewpoint of production cost. Because of this, upgrading the sensitivity of the radiation sensitive resin compositions has also become an important task. The requirement for upgrading the sensitivity of the radiation sensitive resin compositions is not limited to the production of the semiconductor integrated circuits. The same requirement is directed to the production of the display plane of a liquid crystal display device in a LCD panel and the fabrication of a circuit substrate for a thermal head or the like. These are also required to all materials utilizing the photosensitive properties to exposure radiation such as UV inks, UV paints, UV adhesives, photo recording materials, photo molding materials.

In order to meet the high sensitization, for example, in a radiation sensitive resin composition containing a resin and a photosensitive material, methods have been taken wherein the molecular weight of the resin in the composition is made smaller or the amount to be added of the photosensitive material (photosensitier) is decreased. These methods, however, have some problems. That is, as the heat resistance of the resulting resist lowers, the etching resistance of the resist drops in the production of semiconductor devices and the like or as the developability becomes so poor that scum (residue in development) is formed and the highly normalized film remaining characteristics rate drops. In order to solve these problems, the many techniques involving following techniques have been proposed. That is a technique using a novolak resin mixture which is derived from specific phenol compounds and has a specified molecular weight ranges (JP-A No. 7-271,024); a technique using both a novolak resin which is derived from a specific phenol compound and has a specific molecular weight range and a degree of dispersion, and a polyhydroxy compound having phenolilc hydroxyl groups (JP-A No. 8-184,963); a technique using a photosensitive material component comprising a certain proportion of naphthoquinonediazidesulfonic acid ester of trihydroxybenzophenone and trihydroxybenzophenone (JP-A No. 8-82,926); and so on. The addition of a specific sensitizer has also been proposed.

In addition, also in a radiation sensitive resin composition containing a resin and a photoacid generator, in order to meet the high sensitization, methods have been taken wherein the molecular weight of the resin in the composition is made smaller or the amount to be added of the photoacid generator is increased. However, as in the case of the radiation sensitive resin composition using a photosensitive material, the above-described methods have the problems that the etching resistance drops in the production of semiconductor devices due to the reduction of heat resistance of the resulting resists, and that the developability becomes so poor that scum is formed, and further that the process latitude decreases. Because of these problems, as for the radiation sensitive resin compositions containing a resin and a photoacid generator, many developments have been made from the standpoints of the resin and the photoacid generator. Many reports are made so far. The reports involve, for example, concerning the resins, many protective groups which are cleaved by the action of an acid so as to increase the solubility of the resins in an alkaline developing solution (JP-A Nos. 9-281,706, 9-292,708, and so on) and, concerning the photoacid generators, a photoacid generator composed of an oxime sulfonate compound (JP-A No. 9-211, 846) and a photoacid generator containing a straight-chain, branched or cyclic alkyl sulfonate (JP-A No. 9-323,970).

However, none of these proposals satisfactorily solve the problems. Therefore, radiation sensitive resin compositions free from these problems, having a high sensitivity, good developability, high resolution, and excellent highly normalized film remaining characteristics, and providing good pattern shapes are required.

On the other hand, the utilization of a fluorescent material in photolithography, e.g., the addition of the fluorescent material to a radiation sensitive resin composition, has been already practiced. For example, JP-A Nos. 62-288,822 and 1-261,632 disclose that a layer containing a fluorescent material is formed independently of a photoresist layer and the photoresist is sensitized by both exposure radiation and the fluorescence emitted from the fluorescent material upon exposure to radiation to thereby upgrade effective sensitivity. JP-A No. 62-81,634 discloses that a photoresist contains a fluorescent material, which emits fluorescence having a wavelength range corresponding to the radiation sensitive wavelength range of the photoresist, to thereby upgrade effective sensitivity. However, these inventions are characterized by the utilization of the fluorescence emitted from the fluorescent material and the sensitivity was not sufficiently upgraded. Besides, JP-A Nos. 7-319,155 and 8-217, 815 disclose that a chemically amplified photoresist contains an anthracene derivative, which is a fluorescent material, to thereby upgrade a halation preventing effect on a high-reflectivity substrate. However, in these publications, no mention is made of upgrading sensitivity. In addition since the content of the anthracene derivative in the photoresist is high, the sensitivity is not upgraded.

In view of the foregoing, an object of the present invention is to provide a composition comprising a resin and a photosensitive material or a resin and a photoacid generator which can fully meet the characteristics hitherto required.

That is, the object of the present invention is to provide a radiation sensitive resin composition comprising at least both a resin and a photosensitive material or at least both a resin and a photoacid generator which has an upgraded sensitivity.

Another object of the present invention is to provide a radiation sensitive resin composition comprising at least both a resin and a photosensitive material or at least both a resin and a photoacid generator which has a high resolution, excellent highly normalized film remaining characteristics, capability of forming good pattern, and upgraded sensitivity.

DISCLOSURE OF THE INVENTION

As a result of intensive investigation, the inventors have found that the above-mentioned objects can be attained by the incorporation of a specific amount of a fluorescent material in a radiation sensitive resin composition comprising a resin and a photosensitive material, such as a radiation sensitive resin composition comprising an alkali-soluble novolak resin and a naphtoquinonediazide compound, or in a radiation sensitive resin composition comprising a resin and a photoacid generator, thus having achieved the present invention based on the finding.

Accordingly, the present invention relates to a radiation sensitive resin composition comprising at least both a resin and a photosensitive material, wherein a fluorescent material is incorporated in an amount of 0.0001 to 1.0 parts by weight relative to 100 parts by weight of the photosensitive material.

Further, the present invention relates to a radiation sensitive resin composition comprising at least both a resin and a photoacid generator, wherein a fluorescent material is incorporated in an amount of 1.0 to 30.0 parts by weight relative to 100 parts by weight of the photoacid generator.

In the present invention, although the reason why the incorporation of a specific amount of a fluorescent material in a radiation sensitive resin composition makes it possible to upgrade the sensitivity of the radiation sensitive resin composition is not perfectly clear, the reason is thought as follows according to the present inventors. It should be noted, however, that the present invention is not limited by the following reasoning.

That is, it has been known that the photosensitivity of a photosensitive material or a photoacid generator differs depending on the wavelengths of exposure radiation. For example, when a radiation sensitive resin composition comprising a resin and a photosensitive material is exposed using g-line, h-line or i-line as exposure radiation, the highest photosensitivity of the photosensitive material is obtained by g-line radiation, followed by h-line radiation and i-line radiation in that order. Therefore, for example, in order to upgrade the sensitivity of the radiation sensitive resin composition containing a photosensitive material at the time of i-line exposure, a conceivable method is one wherein the radiation energy of the i-line is converted into an energy corresponding to g-line or h-line providing a higher sensitivity. Meanwhile, it is known that, in the case of a photoacid generator, the sensitivity of the resist becomes maximal when the wavelength, at which the sensitization rate of the photoacid generator becomes maximal, coincides with the wavelength of the exposure radiation. For example, when i-line radiation is used as the exposure radiation, the wavelength at maximum photosensitivity of the photoacid generator is preferably 365 nm which is the wavelength of the i-line. In actuality, however, the wavelength of the exposure radiation does not coincide with the wavelength at which the photosensitivity of the photoacid generator becomes maximal and, in many cases, the discrepancy between these wavelengths is generally about 50 nm. The same holds true with the case where g-line or h-line is used as the exposure radiation. This is because a radiation source, which emits radiation having the same wavelength as the wavelength at maximum photosensitivity of the photoacid generator, is not deliberately used. Normally, an extra-high pressure mercury lamp is used as a radiation source for exposure and a radiation having the above-mentioned wavelength, i e., g-line, h-line or i-line, is selected from the radiations having a mixture of wavelengths and used. Therefore, the wavelength of the exposure radiation is limited.

As stated above, irrespective of the use of a photosensitive material or a photoacid generator, what is necessary for upgrading the photosensitivity of the radiation sensitive resin composition is conversion of the exposure radiation energy into an energy corresponding to the wavelength at maximum photosensitivity of the photosensitive material or the photoacid generator. In this case, when a specific amount of a fluorescent material is added to the radiation sensitive resin composition, which contains a resin and a photosensitive material or a resin and a photoacid generator, the above-mentioned energy conversion is thought to be performed utilizing a phenomenon of excitation energy transfer and the upgrading of the photosensitivity can be achieved without the impairment of other characteristics of the resist.

A model of this phenomenon of excitation energy transfer is the Foerster-type model of excitation energy transfer. Referring now to the Foerster-type model of excitation energy transfer, the reason why the effect of the present invention is obtained will be further explained. As described in Foerster, Th. Naturwiss, 33(1946), pp.166–171, the feature of the Foerster-type model of excitation energy transfer lies in that fluorescent light is not involved in the excitation energy transfer from donor to acceptor despite the use of a fluorescent material. When fluorescent light is involved, the excitation energy of an excitable substance is deactivated at the time when the excited fluorescent material emits the fluorescent light. However, according to the Foerster-type excitation energy transfer, the excitation energy transfer from donor to acceptor is carried out without the emission of fluorescent light, i.e., without the deactivation of the excitation energy. A model utilizing this Foerster-type phenomenon of excitation energy transfer is the antenna dye system in photosynthesis of plants. According to this system, solar light having short wavelengths undergoes several wavelength conversion steps and is converted into energy having long wavelengths corresponding to absorption peaks of the central photosynthesis reaction. This excitation energy transfer efficiency is almost 100%. No fluorescent light is involved in the excitation energy transfer in the antenna dye system of photosynthesis which selects the most efficient process in the long period of evolution. From this aspect, it can be understood that the efficiency of the Foerster-type excitation energy transfer having no fluorescent light involved is very high relative to excitation energy transfer having fluorescent light involved. The technologies described in the above-cited JP-A Nos. 62-288,822, 1-261, 632 and 62-81,634 all utilize excitation energy transfer having fluorescent light involved and the utilization efficiency of the excitation energy of these technologies is low. To the contrary, the utilization efficiency of the excitation energy of the technology of the present invention utilizing the Foerster-type excitation energy transfer, i.e., excitation energy transfer involving no fluorescent light, is very high. Besides, the largest difference between the case where excitation energy transfer involving fluorescent light is utilized and the case where excitation energy transfer involving no fluorescent light is utilized is the concentration of the fluorescent material in the system. In the prior art described in the former case, an extremely large amount of the fluorescent material is incorporated in comparison with the case of the present invention. Therefore, unlike the present invention, which uses the fluorescent material at a low or very low concentration and realizes the excitation energy transfer involving no fluorescent light, the prior art cannot realize such excitation energy transfer and cannot utilize the excitation energy efficiently.

Further details of the present invention are described below.

A. A Radiation Sensitive Resin Composition Comprising at Least Both a Resin and a Photosensitive Material (Resin)

Examples of the resin in the radiation sensitive resin composition comprising at least both a resin and a photosensitive material of the present invention include an alkali-soluble resin. Although the alkali-soluble resin may be any one of the alkali-soluble resins employed as constituent materials of conventional radiation sensitive resin compositions, an alkali-soluble novolak resin obtainable by a polycondensation between at least one kind of phenols and an aldehyde such as formalin is preferable among the alkali-soluble resins.

Preferred examples of the phenols for the alkali-soluble novolak resins include cresols such as o-cresol, p-cresol, and m-cresol; xylenols such as 3,5-xylenol, 2,5-xylenol, 2,3-xylenol, and 3,4-xylenol; trimethylphenols such as 2,3,4-trimethylphenol, 2,3,5-trimethylphenol, 2,4,5-trimethylphenol, and 3,4,5-trimethylphenol; t-butylphenols such as 2-t-butylphenol, 3-t-butylphenol, and 4-t-butylphenol; methoxyphenols such as 2-methoxyphenol, 3-methoxyphenol, 4-methoxyphenol, 2,3-dimethoxyphenol, 2,5-dimethoxyphenol, and 3,5-dimethoxyphenol; ethylphenols such as 2-ethylphenol, 3-ethylphenol, 4-ethylphenol, 2,3-diethylphenol, 3,5-diethylphenol, 2,3,5-triethylphenol, and 3,4,5-triethylphenol; chlorophenols such as o-chlorophenol, m-chlorophenol, p-chlorophenol, and 2,3-dichlorophenol; resorcinols such as resorcinol, 2-methylresorcinol, 4-methylresorcinol, and 5-methylresorcinol; catechols such as 5-methylcatechol; pyrogallols such as 5-methylpyrogallol; bisphenols such as bisphenols A, B, C, D, E, and F; methylolated cresols such as 2,6-dimethylol-p-cresol; naphthols such as α-naphthol and β-naphthol; and so on. These may be used singly or in a combination of two or more.

Examples of the aldehydes include, besides formalin, salicylaldehyde, paraformaldehyde, acetaldehyde, benzaldehyde, hydroxybenzaldehyde, chloroacetaldehyde, and so on. These may be used singly or in a combination of two or more.

The alkali-soluble resin may be one whose low-molecular-weight components are selectively eliminated. Examples of the method for selectively eliminating low-molecular-weight components include a liquid-liquid separation method wherein a novolak resin is separated into portions in two solvents each having a different solvency and a method wherein the low-molecular-weight components are centrifugally eliminated.

(Photosensitive Material)

Meanwhile, the photosensitive material is, for example, a substance which, when irradiated with light whose wavelength range overlaps with the absorption band of the photosensitive material, induces a chemical change and changes the solubility of the radiation sensitive resin composition in water or in an organic solvent.

A compound having a quinonediazide group is, for example, a typical compound as the photosensitive material to be used together with the alkali-soluble resin. The compound having a quinonediazide group usable in the present invention may be any one of the known photosensitive materials conventionally employed in quinonediazide-novolak based resists. Preferred examples of the compound having a quinonediazide group include a compound obtainable from the reaction between a quinonediazidesulfonic acid halide, such as naphthoquinonediazidesulfonic acid chloride and benzoquinonediazidesulfonic acid chloride, and a low-molecular-weight compound or a polymeric compound having a functional group capable of reacting with the acid halide by condensation. Examples of the functional group capable of condensing with the acid halide include a hydroxyl group, an amino group, and so on. Among these groups, a hydroxyl group is particularly suitable.

Examples of the compound containing a hydroxy group capable of condensing with a quinonediazidesulfonic acid halide include hydroquinone, resorcinol, hydroxybenzophenones such as 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone, and 2,2',3,4,6'-pentahydroxybenzophenone; hydroxyphenylalkanes such as bis(2,4-dihydroxyphenyl)methane, bis(2,3,4-trihydroxyphenyl)methane, and bis(2,4-dihydroxyphenyl)propane; hydroxytriphenylmethanes such as 4,4',3",4"-tetrahydroxy-3,5,3',5'-tetramethyltriphenylmethane and 4,4',2",3",4"-pentahydroxy-3,5,3',5'-tetramethyltriphenylmethane; and so on. These may be used singly or in a combination of two or more.

The amount to be incorporated of the compound having a quinonediazide group is normally 5 to 50 parts by weight, preferably 10 to 40 parts by weight, relative to 100 parts by weight of the alkali-soluble resin.

(Additives)

If necessary, the radiation sensitive resin composition may contain a dye, an adhesion aid, a surfactant, and the like. Examples of the dye include methyl violet, crystal violet, malachite green, and so on. Examples of the adhesion aid include alkyl imidazoline, butyric acid, alkylic acid, polyhydroxystyrene, polyvinyl methyl ether, t-butyl novolak, epoxysilane, epoxy polymers, silanes, hexamethyldisilane, chloromethylsilane, and so on. Examples of the surfactant include nonionic surfactants, e.g., polyglycols and derivatives thereof such as polypropylene glycol and polyoxyethylene lauryl ether; fluorine-containing surfactants, e.g., Florade (trade name, manufactured by Sumitomo 3M Limited), Megafac (trade name, manufactured by Dainippon Ink & Chemicals Inc.), and Sulfron (trade name, manufactured by Asahi Glass Co., Ltd.); organosiloxane-based surfactants e.g., KP341 (trade name, manufactured by Shin-Etsu Chemical Co., Ltd.).

As stated above, a radiation sensitive resin composition, which uses an alkali-soluble novolak resin as a resin and a quinonediazide compound as a photosensitive material, is explained in detail. However, it should be noted that the radiation sensitive resin composition of the present invention comprising at least both a resin and a photosensitive material is not limited to the above-described radiation sensitive resin composition which uses an alkali-soluble novolak resin and a quinonediazide compound. Therefore, the radiation sensitive resin composition of the present invention comprising at least both a resin and a photosensitive material, includes publicly or generally known radiation sensitive resin compositions comprising a resin and a photosensitive material, for example, a radiation sensitive resin composition comprising a binder resin, a compound having a vinyl group, and a photopolymerization initiator; a radiation sensitive resin composition using a polymer containing a functional group having a photo-crosslinking function in the side chain; a radiation sensitive resin composition using an aromatic azide compound or bisazide compound; a radiation sensitive resin composition using a water-soluble resin and an aromatic azide compound; and so on.

B. Radiation Sensitive Resin Composition Comprising at Least Both a Resin and a Photoacid Generator Examples of the radiation sensitive resin composition comprising at least both a resin and a photoacid generator of the present invention include a radiation sensitive resin composition comprising a resin, which is rendered alkali-insoluble by partially protecting a group imparting alkali-solubility with a protective group capable of being cleaved by an acid (this resin is hereinafter referred to as "alkali-insoluble resin"), and a photoacid generator (a positive-working); a radiation sensitive resin composition comprising an alkali-soluble resin, a crosslinking agent, and a photoacid generator (a negative-working); and so on.

(Alkali-insoluble Resins)

Examples of the alkali-insoluble resins include the following:

(i) reaction products from (a) a homopolymer of a hydroxystyrene, a copolymer of a hydroxystyrene with other monomer (comonomer), or a phenol resin and (b) a vinyl ether compound or a dialkyl dicarbonate (wherein the alkyl group has 1 to 5 carbon atoms), (ii) homopolymers of a reaction product from a hydroxystyrene and a vinyl ether compound or a dialkyl dicarbonate (wherein the alkyl group has 1 to 5 carbon atoms) or copolymers of the above-mentioned reaction product with other monomer, and (iii) polymers wherein part of the protective group in the above-mentioned homopolymers or copolymers having the group protected by a protective group have been cleaved by an acid as necessary.

Although the alkali-insoluble resin is preferably one whose basic structure is an alkali-soluble polymer containing a hydroxystyrene as repeating units, the alkali-insoluble resin is not limited to this type of polymer. Therefore, the alkali-insoluble resin may be appropriately selected by taking into account the purpose of use of the radiation sensitive resin composition, wavelength of the radiation for exposure, production conditions of the resin and the composition, formulation of the composition, and so on. Preferred examples of the hydroxystyrene to be used for the preparation of these polymers are 4-hydroxystyrene, 3-hydroxystyrene, and 2-hydroxystyrene. The 4-, 3-, or 2-hydroxystyrene is converted into an alkali-insoluble resin as described above, that is, 4-, 3-, or 2-hydroxystyrene undergoes a homopolymerization to become poly(4-hydroxystyrene), poly(3-hydroxystyrene), or poly(2-hydroxystyrene); undergoes a copolymerization with other monomer to become a binary or ternary copolymer and thereafter a protective group is introduced into the copolymer; or alternatively, 4-, 3-, or 2-hydroxystyrene having a protective group introduced undergoes a homopolymerization or a copolymerization with other monomer. Further, the alkali-insoluble resin may be prepared by cleaving with an acid a part of the protective group of the alkali-insoluble resin having the protective group and prepared in the above-described ways.

Examples of the other monomer to be used in copolymerization with a hydroxystyrene for the preparation of the above-described copolymer include 4-, 3- or 2-acetoxystyrene, 4-, 3- or 2-alkoxystyrene, a -methylstyrene, 4-, 3- or 2-alkylstyrene, 3-alkyl-4-hydroxystyrene, 3,5-dialkyl-4-hydroxystyrene, 4-, 3- or 2-chlorostyrene, 3-chloro-4-hydroxystyrene, 3,5-dichloro-4-hydroxystyrene, 3-bromo-4-hydroxystyrene, 3,5-dibromo-4-hydroxystyrene, vinylbenzyl chloride, 2-vinylnaphthalene, vinylanthracene, vinylaniline, vinylbenzoic acid, vinylbenzoic acid esters, N-vinylpyrrolidone, 1-vinylimidazole, 4- or 2-vinylpyridine, 1-vinyl-2-pyrrolidone, N-vinyllactam, 9-vinylcarbazole, vinyl benzoate, acrylic acid and derivatives thereof, methacrylic acid and derivatives thereof, e.g., methyl methacrylate and derivatives thereof, methacrylamide and derivatives thereof, acrylonitrile, methacrylonitrile, 4-vinylbenzoic acid esters, 4-vinylphenoxyacetic acid and derivatives thereof, e.g., 4-vinylphenoxyacetic acid esters, maleimide and derivatives thereof, N-hydroxymaleimide and derivatives thereof, maleic anhydride, maleic acid or fumaric acid and derivatives thereof, e.g., esters of maleic acid or fumaric acid, vinyltrimethylsilane, vinyltrimethoxysilane, vinylnorbornene and derivatives thereof, and so on.

In addition, preferred examples of the other monomer include isopropenylphenol, propenylphenol, (4-hydroxyphenyl)acrylate or methacrylate, (3-hydroxyphenyl)acrylate or methacrylate, (2-hydroxyphenyl)acrylate or methacrylate, N-(4-hydroxyphenyl)acrylamide or methacrylamide, N-(3-hydroxyphenyl)acrylamide or methacrylamide, N-(2-hydroxyphenyl)acrylamide or methacrylamide, N-(4-hydroxybenzyl)acrylamide or methacrylamide, N-(3-hydroxybenzyl)acrylamide or methacrylamide, N-(2-hydroxybenzyl)acrylamide or methacrylamide, 3-(2-hydroxy-hexafluoropropyl-2)-styrene, 4-(2-hydroxy-hexafluoropropyl-2)-styrene, and so on.

On the other hand, examples of the vinyl ether compound, which modifies the group imparting alkali-solubility to form a protective group capable of being cleaved by an acid, include vinyl ethers such as methyl vinyl ether, ethyl vinyl ether, n-butyl vinyl ether, t-butyl vinyl ether, 2-chloroethyl vinyl ether, 1-methoxyethylvinylether, 1-benzyloxyethylvinylether, and the like; isopropenyl ethers such as isopropenyl methyl ether, isopropenyl ethyl ether, and the like; cyclic vinyl ethers such as 3,4-dihydro-2H-pyran and the like; and divinyl ethers such as butanediol-1,4-divinyl ether, ethylene glycol divinyl ether, triethylene glycol divinyl ether, and the like. These vinyl ether compounds may be used singly or in a combination of two or more.

A preferred compound as the dialkyl carbonate is, for example, di-t-butyl dicarbonate.

Examples of the alkali-soluble phenol resin, which constitutes the basic component of the alkali-insoluble resin, include the same alkali-soluble novolak resin as the alkali-soluble resin to be used in the radiation sensitive resin composition containing a photosensitive material, described previously in A, and other alkali-soluble phenol resin.

As for the phenols and formaldehydes as starting materials for the preparation of these alkali-soluble phenol resins, the same materials as those described previously in A are preferable. These respective materials may be used singly or as a mixture of two or more.

(Alkali-soluble Resins)

Preferred examples of the alkali-soluble resins, which are used in the negative-working radiation sensitive resin composition, include the same alkali-soluble novolak resins as those described previously in A as well as homopolymers of hydroxystyrenes and copolymers of hydroxystyrenes with other monomers (comonomers) to be used for the preparation of the alkali-insoluble resins. More preferred examples of the homopolymers of hydroxystyrenes and the copolymers of hydroxystyrenes with other monomers (comonomers) include polyhydroxystyrene; copolymers of hydroxystyrene with an acrylic acid derivative, acrylonitrile, a methacrylic acid derivative, methacrylonitrile, styrene, and a styrene derivative such as α-methylstyrene, p-methylstyrene, o-methylstyrene, p-methoxystyrene, or p-chlorostyrene; hydrogenation products of homopolymers of hydroxystyrenes; and hydrogenation products of copolymers of hydroxystyrenes with the above-mentioned acrylic acid derivatives, methacrylic acid derivatives, or styrene derivatives.

(Photoacid Generators)

The photoacid generator is a compound which, when irradiated with radiation, generates an acid. Examples of the photoacid generator include compounds known as photoacid generators of, for example, a chemically amplified resist such as onium salts, halogen-containing compounds, diazomethane compounds, sulfone compounds, sulfonic acid compounds, and so on. Preferred photoacid generators are showed below. That is, preferred examples of the onium salt include iodonium salts, sulfonium salts, diazonium salts, ammonium salts, pyridinium salts, and the like of triflate or hexaflate. Preferred examples of the halogen-containing compound include a hydrocarbon compound containing a haloalkyl group and a heterocyclic compound containing a haloalkyl group such as a (trichloromethyl)-s-triazine derivative, e.g., phenyl-bis(trichloromethyl)-s-triazine, methoxyphenyl-bis(trichloromethyl)-s-triazine, or the like, a bromine compound, e.g., tribromoneopentyl alcohol, hexabromohexane, or the like, an iodine compound, e.g., hexaiodohexane or the like, and so on. Preferred examples of the diazomethane compound include bis(trifluoromethylsulfonium)diazomethane, bis(cyclohexylsulfonium)diazomethane, and so on. Preferred examples of the sulfone compound include β-ketosulfone, β-sulfonylsulfone, and so on. Examples of the sulfonic acid compound include alkyl($C_{1-12}$)sulfonic acid esters, haloalkyl($C_{1-12}$)sulfonic acid esters, arylsulfonic acid esters, iminosulfonates, and so on.

These photoacid generators may be used singly or in a combination of two or more. The amount to be incorporated is normally 0.1 to 10 parts by weight, preferably 0.5 to 5.0 parts by weight, relative to 100 parts by weight of the alkali-soluble resin or the alkali-insoluble resin.

(Crosslinking Agents)

Preferred examples of the crosslinking agent include alkoxyalkylated melamine resins, alkoxyalkylated urea resins, and the like, besides melamine type, benzoguanamine type, and urea type crosslinking agents. Specific examples of these alkoxyalkylated amino resins include methoxymethylated melamine resins, ethoxymethylated melamine resins, propoxymethylated melamine resins, butoxymethylated melamine resins, methoxymethylated urea resins, ethoxymethylated urea resins, propoxymethylated urea resins, butoxymethylated urea resins, and so on.

These crosslinking agents may be used singly or in a combination of two or more. The amount to be incorporated is normally 2 to 50 parts by weight, preferably 5 to 30 parts by weight, relative to 100 parts by weight of the alkali-soluble resin.

(Additives)

It is preferable to incorporate a basic compound as an additive in the radiation sensitive resin composition containing a photoacid generator of the present invention. The basic compound can control the phenomenon of diffusion of the acid produced from the photoacid generator by exposure in the resist film so as to upgrade the resolution and improve the exposure latitude and the like. Examples of the basic compound include primary, secondary, or tertiary aliphatic amines, aromatic amines, heterocyclic amines, nitrogen-containing compounds having alkyl groups, aryl groups, or the like, compounds containing amido groups or imido groups, and so on.

Further, the same additives, i.e., dyes, adhesion aids, surfactants, and the like, as the additives for the radiation sensitive resin composition containing a photosensitive material described previously in A may be incorporated as necessary.

C. Fluorescent Materials

Examples of the fluorescent material to be used in the radiation sensitive resin composition of the present invention include organic fluorescent materials such as naphthalene and naphthalene derivatives, e.g., 1-hydroxynaphthalene, 1-methylnaphthalene, 2,3-dimethylnaphthalene, 1-aminonaphthalene, 2-fluoronaphthalene, 2-chloronaphthalene, 1,7-diphenylnaphthalene,and the like; anthracene and anthracene derivatives, eg., 9-methylanthracene, 9,10-dimethylanthracene, 9-cyanoanthracene, 1-aminoanthracene, 9-phenylanthracene, 9,10-diphenylanthracene, 9,10-dichloroanthracene, 9,10-dinaphthylanthracene, 9-vinylanthracene, 9-(p-vinylphenyl)-10-phenylanthlracene, and the like; phenanthrene and phenanthrene derivatives, e.g., 3,4'-benzophenanthrene, 2-phenylphenanthrene, and the like; pyrene and pyrene derivatives, e.g., 1,3,6,8-tetraphenylpyrene, bipyrenyl, o-phenylenepyrene, and the like; perylene and perylene derivatives, e.g., benzoperylene and the like; fluorene and fluorene derivatives, e.g., 1-methylfluorene, 1,2-benzofluorene, and the like; carbazole and carbazole derivatives, e.g., N-methylcarbazole, N-methylbenzocarbazole, N-phenylcarbazole, N-vinylcarbazole, and the like; biphenyl and biphenyl derivatives, e.g., 4-methylphenylbiphenyl, 3,3'-dimethylbiphenyl, 4-methoxybiphenyl, 4,4'-dimethoxybiphenyl, 4,4'-dihydroxybiphenyl, 4-benzylbiphenyl, 4-vinylbiphenyl, octamethylbiphenyl and the like; p-terphenyl and p-terphenyl derivatives, e.g., 4-methylterphenyl, 2-methyl-p-terphenyl, 3,3"-dimethylterphenyl, 4-(3,3-dimethylbutoxy)-p-terphenyl, 2,2'-methylene-p-terphenyl, and the like; p-quaterphenyl and p-quaterphnyl derivatives, e.g., 3,3'''-dimethyl-p-quaterphenyl, tetramethyl-p-quaterphenyl, 4-(3-ethylbutoxy)-p-quaterphenyl, and the like; indole and indole derivatives, e.g., 2-phenylindole, 1-methyl-2-phenylindole, 1-N-butyl-2-biphenylindole, 1,2-diphenylindole, 1-biphenyl-2-indole, and the like; acridine and derivatives thereof, naphthacene and derivatives thereof; rublene and derivatives thereof; chrysene and derivatives thereof; and so on. Among these compounds, anthracene and anthracene derivatives are preferable.

It is preferable that these fluorescent materials are selected by taking into account the wavelength of the exposure radiation to used and the absorption wavelength range of the photosensitive material to be combined. These fluorescent materials may be used singly or in a combination of two or more. In the case where the radiation sensitive resin composition is a radiation sensitive resin composition comprising at least both a resin and a photosensitive material, the amount of the fluorescent material to be incorporated is 0.0001 to 1.0 parts by weight relative to 100 parts by weight of the photosensitive material. In the case where the radiation sensitive resin composition is a radiation sensitive resin composition comprising at least both a resin and a photoacid generator, the amount of the fluorescent material to be incorporated is 1.0 to 30.0 parts by weight relative to 100 parts by weight of the photoacid generator. When the amount of the fluorescent material to be incorporated is outside the range of 0.0001 to 1.0 parts by weight or outside the range of 1.0 to 30.0 parts by weight, it is difficult to upgrade the sensitivity of the composition in an efficient way.

D. Solvents

The solvent for the radiation sensitive resin of the present invention is preferably one capable of dissolving the alkali-soluble resin, alkali-insoluble resin, photosensitive material, crosslinking agent, photoacid generator, and others. Examples of the solvent include ethylene glycol monoalkyl ethers such as ethylene glycol monomethyl ether, ethylene glycol monoethyl ether, and the like; ethylene glycol monoalkyl ether acetates such as ethylene glycol monomethyl ether acetate, ethylene glycol monoethyl ether acetate, and the like; propylene glycol monoalkyl ethers such as propylene glycol monomethyl ether, propylene glycol monoethyl ether, and the like; propylene glycol monoalkyl ether acetates such as propylene glycol monomethyl ether acetate propylene glycol monoethyl ether acetate, and the like; lactates such as methyl lactate, ethyl lactate, and the like; aromatic hydrocarbons such as toluene, xylene and the like; ketones such as methyl ethyl ketone, 2-heptanone, cyclohexanone, and the like; amides such as N,N-dimethylacetamide, N-methylpyrrolidone, and the like; lactones such as γ-butyrolactone and the like; and so on. These solvents are used singly or in a combination of two or more.

Furthermore, the radiation sensitive resin composition of the present invention can be utilized, besides as a photoresist, as a material for all applications including UV inks, UV paints, UV adhesives, photo recording materials and photo molding materials in which photosensitive properties to exposure radiation is utilized. For example, in the case of UV-hardenable inks, paints, and adhesives, the irradiation with ultraviolet rays causes the crosslinking of the composition and the composition is hardened. In this case, the addition of a fluorescent material in combination with a pigment, a prepolymer, a monomer, a polymerization initiator, and additives can upgrade the effective sensitivity of the composition. The use of a fluorescent material together with a photosensitive material can upgrade the effective sensitivity of photo recording materials in the fields of electrophotography, organic memory materials of optical disks, holograms, and the like; and can also upgrade the effective sensitivity of photo molding materials in the fields of mother molds for molds, dental forming materials, and the like.

The following examples and comparative examples illustrate the present invention in more detail. These examples and comparative examples are not to be construed to limit the modes of the present invention.

The novolak resin and the photosensitive material for use in Examples 1 to 7 and Comparative Examples 1 and 2 were synthesized in the following ways.

Synthesis Example 1 (Synthesis of the Novolak Resin)

56 parts by weight of a 37% aqueous solution of formalin and 2 parts by weight of oxalic acid were added to 100 parts by weight a cresol mixture composed of m-cresol and p-cresol at a ratio of 6:4. The resulting mixture was allowed to react at 100° C. for 5 hours. The molecular weight of the novolak resin obtained was 15,200 based on polystyrene.

Synthesis Example 2 (Synthesis of the Photosensitive Material)

2,3,4,4'-tetrahydroxybenzophenone and 1,2-naphtoquinonediazide-5-sulfonyl chloride at a ratio of 1:2.5

(molar ratio) were added to and dissolved in dioxane and subjected to esterification using triethylamine as a catalyst in an ordinary way. In this way, the photosensitive material was obtained.

BEST MODES FOR CARRYING OUT THE INVENTION

Example 1

100 parts by weight of the novolak resin obtained in Synthesis Example 1, 15 parts by weight of the photosensitive material obtained in Synthesis Example 2, and 0.0001 parts by weight of anthracene as a fluorescent material relative to 100 parts by weight of the photosensitive material were dissolved in propylene glycol monomethyl ether acetate. To the resulting solution, 300 ppm of a fluorine-based surfactant, Florade 472 (manufactured by Sumitomo 3M Limited), was added so as to prevent radial wrinkles or so-called striation to be formed on the resist film at the time of spin coating. After being stirred, the solution underwent filtration through a 0.2 μm filter. In this way, a radiation sensitive resin composition was prepared. The composition was spin-coated on a 4-inch silicon wafer and the coating was baked at 100° C. for 90 seconds on a hot plate to obtain a resist film having a thickness of 1.5 μm. The resist film was exposed using a test pattern having various line and space widths at 1:1 in an i-line stepper (LD-5015iCW manufactured by Hitachi Ltd.) and developed for 60 seconds using AZ® 300MIF developing solution (manufactured by Clariant (Japan) K.K., 2.38% by weight aqueous solution of tetramethylammonium hydroxide). After the development, the sensitivity of the pattern was assessed as an amount of exposure energy providing a 1:1 resolution of 5 μm line-and-space. The result is shown in Table 1.

Examples 2 to 7 and Comparative Examples 1 and 2

The results shown in Table 1 were obtained by carrying out the same procedure as in Example 1, except that the amounts (in parts by weight) of the anthracene relative to 100 parts by weight of the photosensitive material varied according to Table 1.

TABLE 1

| | Amounts of anthracene relative to 100 parts by weight of the photosensitive material (parts by weight) | Sensitivity (mJ/cm$^2$) |
|---|---|---|
| Example 1 | 0.0001 | 18.7 |
| Example 2 | 0.001 | 17.7 |
| Example 3 | 0.005 | 16.8 |
| Example 4 | 0.01 | 17.0 |
| Example 5 | 0.1 | 18.6 |
| Example 6 | 0.5 | 18.9 |
| Example 7 | 1.0 | 19.3 |
| Comparative Example 1 | 0.0 | 20.1 |
| Comparative Example 2 | 2.0 | 24.8 |

Example 8

(1) m, p-cresol novolak resin 100 parts by weight (m/p=6/4, weight average molecular weight based on polystyrene: 4000)
(2) ethoxymethylated benzoguanamine resin 10 parts by weight
(3) 2,4,6-tris(trichloromethyl)triazine [photoacid generator] 2 parts by weight
(4) fluorine-based surfactant, Florade 472 300 ppm (manufactured by Sumitomo 3M Limited), and
(5) anthracene in an amount of 1.0 part by weight relative to 100 parts by weight of the photoacid generator of (3) were dissolved in propylene glycol monomethyl ether acetate. The resulting solution was filtered through a 0.2 μm Teflon membrane filter. In this way, a negative-working radiation sensitive resin composition was prepared. The composition was spin-coated on a 4-inch silicon wafer and the coating was baked at 100° C. for 90 seconds on a hot plate to obtain a resist film having a thickness of 1.5 μm. The resist film was exposed using a test pattern having various line and space widths at 1:1 in an i-line stepper (LD-5015iCW manufactured by Hitachi Ltd.) and thereafter baked at 130° C. for 90 seconds on a hot plate. Then, the resist film was developed for 80 seconds using AZ® 300MIF developing solution (manufactured by Clariant (Japan) K.K., 2.38% by weight aqueous solution of tetramethylammonium hydroxide). After the development, the sensitivity of the pattern was assessed as an amount of exposure energy providing a 1:1 resolution of 5 μm line-and-space. The result is shown in Table 2.

Examples 9 to 11 and Comparative Examples 3 and 4

The results shown in Table 2 were obtained by carrying out the same procedure as in Example 8, except that the amounts (in parts by weight) of the anthracene relative to 100 parts by weight of the photoacid generator varied according to Table 2.

In Comparative Example 4, since the amount added of the anthracene was excessive, the photoresist in unexposed region was not completely dissolved after 80 seconds of development. As the result, patterns with 5 μm line-and-space was not formed.

TABLE 2

| | Amounts of anthracene relative to v100 parts by weight of the photoacid generator (parts by weight) | Sensitivity (mJ/cm$^2$) |
|---|---|---|
| Example 8 | 1.0 | 6.0 |
| Example 9 | 5.0 | 5.3 |
| Example 10 | 20.0 | 6.2 |
| Example 11 | 30.0 | 7.0 |
| Comparative Example 3 | 0.0 | 10.1 |
| Comparative Example 4 | 40.0 | — |

Example 12

(1) poly[p-(1-ethoxyethoxy)styrene-p-hydroxystyrene] 100 parts by weight
(2) bis(cyclohexylsulfonyl)diazomethane [photoacid generator] 5 parts by weight
(3) fluorine-based surfactant, Florade 472 300 ppm (manufactured by Sumitomo 3M Limited), and
(4) anthracene in an amount of 1.0 part by weight relative to 100 parts by weight of the photoacid generator of (2) were dissolved in propylene glycol monomethyl ether acetate. The resulting solution was filtered through a 0.2 μm Teflon membrane filter. In this way, a positive-working radiation sensitive resin composition was prepared.

The composition was spin-coated on a 4-inch silicon wafer and the coating was baked at 90° C. for 90 seconds on a hot plate to obtain a resist film having a thickness of 1.0 μm. The resist film was exposed using a test pattern having various line and space widths at 1:1 in a KrF stepper (FPA-3000EX5 manufactured by Canon Inc.) and thereafter baked at 100° C. for 90 seconds on a hot plate. Then, the resist film was developed for 60 seconds using AZ® 300MIF developing solution (manufactured by Clariant (Japan) K.K., 2.38% by weight aqueous solution of tetramethylammonium hydroxide). After the development, the sensitivity of the pattern was assessed as an amount of exposure energy providing a 1:1 resolution of 0.3 μm line-and-space. The result is shown in Table 3.

Examples 13 to 15 and Comparative Example 5

The results shown in Table 3 were obtained by carrying out the same procedure as in Example 13, except that the amounts (in parts by weight) of the anthracene relative to 100 parts by weight of the photoacid generator varied according to Table 3.

TABLE 3

| | Amounts of anthracene relative to 100 parts by weight of the photoacid generator (parts by weight) | Sensitivity (mJ/cm$^2$) |
|---|---|---|
| Example 12 | 1.0 | 10.9 |
| Example 13 | 5.0 | 9.6 |
| Example 14 | 20.0 | 11.2 |
| Example 15 | 30.0 | 12.7 |
| Comparative Example 5 | 0.0 | 18.3 |

From Tables 1 to 3 showing the results of Examples 1 to 15 and Comparative Examples 1 to 5, it can be seen that the incorporation of a specific amount of the fluorescent material in the compositions effectively upgrades the sensitivity of the compositions. Further, in the radiation sensitive resin compositions of Examples 1 to 15, no scum was found in any pattern formed and the highly normalized film remaining characteristics rates and pattern shapes were good.

EFFECT OF THE INVENTION

As stated above, in the present invention, it is possible to obtain a radiation sensitive resin composition having high sensitivity capability to form a good pattern, high resolution, and excellent highly normalized film remaining characteristics

INDUSTRIAL APPLICABILITY

The radiation sensitive resin composition of the present invention is suitable for use as a photoresist material in the fabrication of semiconductor devices, the display plane of a liquid crystal display device, and the circuit substrate for a thermal head and the like. Furthermore, the radiation sensitive resin composition can be utilized as a material for all applications including UV inks, UV paints, UV adhesives, photo recording materials, photo molding materials, and so on in which photosensitive properties to exposure radiation rays is utilized.

What is claimed is:

1. A radiation sensitive resin composition comprising at least both a resin and a photosensitive material, wherein a fluorescent material is incorporated in an amount of 0.0001 to 1.0 part by weight relative to 100 parts by weight of the photosensitive material.

2. A radiation sensitive resin composition according to claim 1 wherein the resin is an alkali-soluble resin.

3. A radiation sensitive resin composition according to claim 2 wherein the alkali-soluble resin is an alkali-soluble novolak resin.

4. A radiation sensitive resin composition according to claim 1 wherein the photosensitive material is a compound containing a quinonediazide group.

* * * * *